US012811529B2

(12) United States Patent
Ruppert

(10) Patent No.: US 12,811,529 B2
(45) Date of Patent: Nov. 24, 2026

(54) EXCITATION CIRCUIT, POWER ELECTRONICS SYSTEM, AND MOTOR VEHICLE

(71) Applicant: AUDI AG, Ingolstadt (DE)

(72) Inventor: Daniel Ruppert, Lenting (DE)

(73) Assignee: AUDI AG, Ingolstadt (DE)

( * ) Notice: Subject to any disclaimer, the term of this patent is extended or adjusted under 35 U.S.C. 154(b) by 227 days.

(21) Appl. No.: 18/747,308

(22) Filed: Jun. 18, 2024

(65) Prior Publication Data

US 2024/0429849 A1 Dec. 26, 2024

(30) Foreign Application Priority Data

Jun. 20, 2023 (DE) ......................... 102023116076.1

(51) Int. Cl.
*H02P 27/06* (2006.01)
*H05K 7/20* (2006.01)

(52) U.S. Cl.
CPC ............. *H02P 27/06* (2013.01); *H05K 7/209* (2013.01)

(58) Field of Classification Search
CPC ...... H02P 2207/05; H02P 27/06; H05K 7/209
See application file for complete search history.

(56) References Cited

U.S. PATENT DOCUMENTS

| | | | | |
|---|---|---|---|---|
| 9,998,047 B2 * | 6/2018 | Rozman | H02K 11/042 |
| 11,476,508 B2 * | 10/2022 | Nozawa | H01M 10/4264 |
| 11,659,698 B2 * | 5/2023 | Ruppert | H02M 1/32 361/718 |
| 2005/0161785 A1 | 7/2005 | Kawashima et al. | |
| 2016/0211786 A1 * | 7/2016 | Rozman | H02K 11/0094 |
| 2020/0328478 A1 * | 10/2020 | Nozawa | B60L 3/0046 |
| 2021/0092882 A1 * | 3/2021 | Ruppert | H05K 7/20927 |
| 2022/0278608 A1 * | 9/2022 | Carden | H02M 3/33507 |
| 2024/0088703 A1 * | 3/2024 | Wang | H02J 7/04 |

FOREIGN PATENT DOCUMENTS

| | | |
|---|---|---|
| CN | 101420181 A | 4/2009 |
| DE | 102017118200 A1 | 2/2018 |
| DE | 102019125733 A1 | 3/2021 |
| DE | 102019128721 A1 | 4/2021 |

* cited by examiner

*Primary Examiner* — Thai T Dinh
(74) *Attorney, Agent, or Firm* — Seed Intellectual Property Law Group LLP

(57) ABSTRACT

An excitation circuit for energizing an excitation winding of an externally excited synchronous machine, the excitation circuit including an encapsulated assembly. The encapsulated assembly includes an electrical circuit having semiconductor switches via which, in operation, an excitation current is provided to excitation current connections of the encapsulated assembly. According to the disclosure, the encapsulated assembly additionally includes at least one gate driver which, in operation, drives the semiconductor switches.

12 Claims, 2 Drawing Sheets

EXCITATION CIRCUIT, POWER ELECTRONICS SYSTEM, AND MOTOR VEHICLE

BACKGROUND

Technical Field

The disclosure relates to an excitation circuit for energizing an excitation winding of an externally excited synchronous machine, the excitation circuit being or comprising an encapsulated assembly, the encapsulated assembly comprising an electrical circuit having semiconductor switches via which an excitation current is providable to excitation current connections of the encapsulated assembly. The disclosure further relates to a power electronics system and to a motor vehicle.

Description of the Related Art

In power electronics systems for electric drives of motor vehicles, a generally three-phase polyphase machine is activated by a drive converter. One possible embodiment of the polyphase machine is the so-called externally excited synchronous machine. This type of machine, in contrast to the permanently excited synchronous machine, does without magnetic materials in the rotor, and generates the rotor magnetic field via an energized excitation winding in the rotor. Additional degrees of freedom in the control and the design of the electric machine are thus possible, so that increases in efficiency and power may be achieved.

The excitation winding is typically energized via slip ring contacts. For energizing the rotor winding, an additional power electronic direct current converter is necessary, which preferably is integrated into the main converter. The integration is generally implemented as a separate circuit board within the converter housing. The connection to the supply voltage of the converter is established via cables, using a plug connection at the existing terminals of the DC link capacitor. The excitation circuit is typically implemented by discrete components situated on a circuit board, which are cooled by the air inside the converter housing.

The described configuration has a relatively complicated design, and requires relatively large dimensions of the power components due to the strictly passive cooling, resulting in high material costs, requires manual connection processes, and due to the connections and line routings used may impair the electromagnetic compatibility.

Therefore, the publication DE 10 2019 125 733 A1 proposes to utilize an encapsulated power module which comprises the power semiconductors and optionally a current sensor system of an excitation circuit, and which for cooling is placeable on a main cooler of a traction converter. However, even with such a design at least some of the above-mentioned drawbacks remain, in particular since additional components are also necessary for achieving good electromagnetic compatibility and for control purposes.

BRIEF SUMMARY

Thus, the object underlying the disclosure is to provide a power module for energizing an excitation winding in an externally excited synchronous machine, by use of which the power electronics system necessary for energizing the synchronous machine may be provided with less complexity.

The object is achieved according to the disclosure by an excitation circuit of the type mentioned at the outset, the encapsulated assembly additionally comprising a shared gate driver or a respective gate driver for the semiconductor switches.

The integration of the gate driver into the encapsulated assembly allows in particular logic signals of a control device, in particular a control device of an inverter for the phase currents of the synchronous machine, to be directly utilized for controlling the semiconductor switches. The gate driver hereby acts as a level converter and an amplifier, for example, via which sufficiently high currents may be provided in order to quickly switch the semiconductor switches and thus minimize switching losses.

The complexity in integrating the excitation circuit into the power electronics system of the synchronous machine is greatly reduced by the integration of the gate driver together with the semiconductor switches as an encapsulated assembly. At the same time, the electromagnetic compatibility and interference immunity of the excitation circuit, and in particular of a drive converter comprising same, may be improved by the resulting shortening of the signal path from the gate driver to the semiconductor switches.

The semiconductor switches may be MOSFETs or IGBTs, for example. In addition to the semiconductor switches, the encapsulated assembly may preferably also include passive power semiconductors, in particular diodes, so that in particular the entire excitation circuit may be integrated as a module into a converter for an externally excited synchronous machine.

At least one of the semiconductor switches may be controllable via at least one control connection of the encapsulated assembly, the gate driver and/or the semiconductor switches being galvanically separated from the control connection. Additionally or alternatively, the gate driver may be energizable via current connections of the encapsulated assembly, wherein a galvanic separation device of the encapsulated assembly galvanically separates the gate driver from the current connections. The galvanic separation of the control connection and the current connections may take place via separate galvanic separation devices or also via a shared galvanic separation device. Circuits for galvanic separation are known per se, and may be integrated into the encapsulated assembly.

By use of the stated measures, the electromagnetic compatibility of the excitation circuit and the protection of a control electronics system from potentially high currents and voltages that are switched by the semiconductor switches may be further improved.

The current connections may be supply lines via which the input voltage of the electrical circuit is also provided. However, they may preferably be separate current connections that are used for energizing low-voltage components, which in addition to the gate driver may include, for example, measuring means explained below.

The encapsulated assembly may comprise at least one respective measuring means for detecting the provided excitation current and/or a dropping supply voltage at the electrical circuit and/or a respective temperature of at least one component of the excitation circuit, in particular at least one of the semiconductor switches. Due to the integration of at least one appropriate measuring means into the encapsulated assembly, the implementation of the excitation circuit may be further simplified and may have a design that is better automatable. In addition, faster detection and processing of the measured variables may potentially be achieved, so that, for example, a shorter delay time in control loops may result, and better control performance may be achieved.

Control or regulation of the provided current as a function of the measured variables of the measuring means may take place by processing the measured data within the encapsulated assembly. However, if the encapsulated assembly is integrated into a converter for an externally excited synchronous machine, it may be advantageous to carry out the processing of the measured data on a processing device, for example a microprocessor or an FPGA, which also controls the converter for the alternating current phases.

The encapsulated assembly may comprise at least one communication connection for providing measurement information concerning the excitation current and/or the supply voltage and/or the particular temperature. The respective communication connection is preferably galvanically decoupled from the measuring means.

Additionally or alternatively, the encapsulated assembly may comprise an analog-to-digital converter that is configured to digitize a particular analog measuring signal that is provided by the particular measuring means, and to provide the resulting digital measured data as the measurement information or as part of the measurement information. In this way, the measured data may be evaluated by an external processing device, for example a microcontroller of a converter, with particularly little effort. In particular a delta-sigma converter may be used as an analog-to-digital converter.

The particular control connection and/or the particular current connection and/or the particular communication connection may each be designed as at least one pin-shaped protrusion that is compressible at least in a contact section in order to mechanically and electrically contact the inner surface of the through hole when the pin-shaped protrusion is accommodated in a through hole of a circuit board. Such a connection may utilize press-fit pin contacts, for example. In particular, this type of contacting may be used for all low-voltage connections of the encapsulated assembly.

Multiple of these protrusions may extend in the same direction of extension, at least approximately in parallel, so that contacting of multiple connections is made possible by mounting the encapsulated assembly on a circuit board via suitable through holes, or by mounting such a circuit board on the encapsulated assembly. Such a connection to a circuit board is easy to carry out and is suitable for automation. The circuit board may, for example, bear a control device for the excitation circuit and/or for an inverter for the phases of an externally excited synchronous machine, and/or may be used for the low voltage supply.

In addition, the manufacturing costs may be reduced by use of such a connection, since, for example, cable supply lines and a crimping operation or the use of cable shoes may be dispensed with, and no handling of plugs and plug connections is necessary during manufacturing.

The electrical circuit may be acted on by voltage via two supply connections of the encapsulated assembly, the encapsulated assembly having a capacitor that is connected between the supply connections. For voltage stabilization and improvement of the electromagnetic compatibility, it is advantageous when a capacitor is connected in parallel to the electrical circuit, between the supply connections. Such a capacitor is also referred to as an X capacitor.

In principle, it is possible to design such a capacitor as a separate component and connect it to the supply connections, or to also use a DC link capacitor for this purpose in a power electronics system, which provides the phase currents for the externally excited synchronous machine and which is typically present anyway. However, particularly good interference suppression is achieved when such a capacitor with very low impedance is attached to the semiconductor switches, which may be accomplished with little effort by integration into the encapsulated assembly.

In addition to the excitation circuit according to the disclosure, the disclosure relates to a power electronics system for energizing an externally excited synchronous machine, comprising at least one inverter for providing the operating current for a particular phase of the externally excited synchronous machine, the power electronics system having an excitation circuit according to the disclosure. As explained in detail above, the use according to the disclosure of the encapsulated assembly is particularly well suited for integrating an excitation circuit into a converter.

The electrical circuit may be acted on by voltage via two supply connections of the encapsulated assembly, a smoothing capacitor being connected between supply lines of the inverter, and the supply connections being directly connected, in particular welded, to connections of the smoothing capacitor. Short line routings and small inductances may thus be achieved between the semiconductor switches beneath [sic; and] and the smoothing capacitor, as a result of which the electromagnetic compatibility, the performance, and the efficiency of the excitation circuit may be further improved.

Instead of a weld connection, other, preferably integrally joined, connections such as soldering or brazing may be used. The smoothing capacitor may in particular be a DC link capacitor for a converter, which provides phase currents of the externally excited synchronous machine.

As a result of this embodiment, the performance and the efficiency of the excitation circuit may be further improved, since due to the direct attachment to the DC link capacitor, the leakage inductance is minimized and the switching operation is thus optimized. In particular, overvoltage oscillations during switching-off operations of the semiconductor switches may be reduced. As a result, no further, potentially complicated filtering measures are generally necessary. In addition, by use of a shared smoothing capacitor, formation of an oscillating circuit due to use of separate smoothing capacitors with inductances in between may be avoided.

The excitation current connections of the excitation circuit, via which the excitation current is provided, are preferably welded or integrally joined in some other way to the supply line to the excitation winding of the externally excited synchronous machine in order to minimize the impedance of the connection.

In one particularly advantageous embodiment of the power electronics system according to the disclosure, a shared control device, for example a microcontroller, is configured to activate both the inverter and the excitation circuit. The complexity in implementing the excitation circuit may thus be further reduced.

If, as explained above, the provided excitation current and/or a supply voltage that is dropping at the electrical circuit and/or a respective temperature of at least one component of the excitation circuit are/is detected, these variables may be evaluated by the shared control device and taken into account in the control of the semiconductor switches of the excitation circuit. For this purpose, as explained above, in particular appropriate measurement information may be digitally provided by the encapsulated assembly to the shared control device.

The encapsulated assembly of the excitation circuit and at least one inverter module of the inverter may be situated at a shared heat sink of an active cooling system. In particular, for each phase of the externally excited synchronous machine a separate inverter module, which for example implements a half bridge associated with the phase, may be situated at the shared heat sink. By way of active cooling, circuit elements, in particular active and passive semiconductor components, may have a smaller design, and a longer service life or a reduction in the thermal stress on the components may be achieved. By use of a shared heat sink for the encapsulated assembly of the excitation circuit and the at least one inverter module, a heat sink, which is typically provided anyway for the inverters associated with the individual phases, may also be used by the excitation circuit, thus reducing component costs.

The disclosure further relates to a motor vehicle comprising an externally excited synchronous machine, the motor vehicle having a power electronics system according to the disclosure that is configured to energize the externally excited synchronous machine. The externally excited synchronous machine may in particular be the drive machine or one of the drive machines of the motor vehicle.

BRIEF DESCRIPTION OF THE SEVERAL VIEWS OF THE DRAWINGS

Further advantages and particulars of the disclosure result from the following exemplary embodiments and the associated drawings, which schematically show the following.

DETAILED DESCRIPTION

Figure 1:
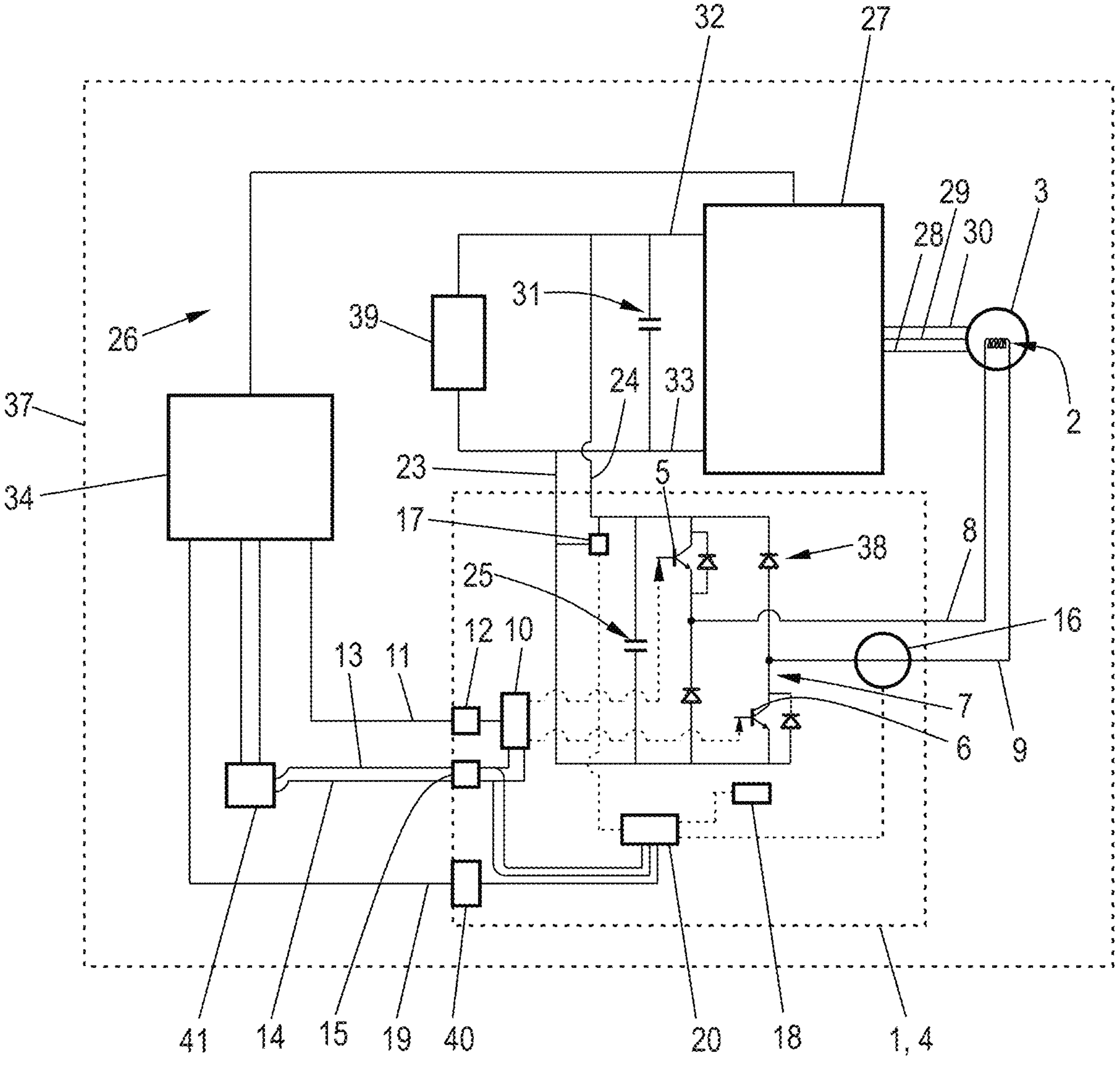
FIG. 1 shows one exemplary embodiment of a power electronics system according to the disclosure, which comprises one exemplary embodiment of an excitation circuit according to the disclosure and is integrated into one exemplary embodiment of a motor vehicle according to the disclosure.

FIG. 1 schematically shows a power electronics system 26 that is used for energizing an externally excited synchronous machine 3. In the example, this power electronics system is integrated into a motor vehicle 37 which is only schematically illustrated as a box, and the externally excited synchronous machine 3 is the drive motor or one of the drive motors of the motor vehicle 37.

In addition to an inverter 27 for providing the operating current for a particular phase 28, 29, 30 of the externally excited synchronous machine 3, the power electronics system 26 also comprises an excitation circuit 1 for energizing the excitation winding 2 of the externally excited synchronous machine 3. To enable integration of the excitation circuit 1 into the power electronics system 26 with the least amount of complexity possible, and thus, for example, to achieve well-automatable manufacture of the power electronics system 26, at least a majority of the components of the excitation circuit 1 are implemented as an encapsulated assembly 4.

The encapsulated assembly 4 comprises an electrical circuit 7 that is formed by two semiconductor switches 5, 6 and a gate driver 10 for the semiconductor switches 5, 6. The passive components of the electrical circuit 7, for example diodes 38, are preferably also integrated into the encapsulated assembly 4.

Due to the integration of the gate driver 10 into the encapsulated assembly 4, the encapsulated assembly may be directly supplied with digital control signals from a control device 34, for example a microcontroller. In particular, the same control device 34 that is also used for controlling the inverter 27 may thus be utilized to additionally control the excitation circuit 1.

The supplying of the inverter 27 via the supply lines 32, 33 and of the excitation circuit 1 takes place via the supply connections 23, 24 when a high power level of the externally excited synchronous machine 3 is to be achieved, preferably via a high-voltage source 39 which may provide voltages of above 40 V or above 100 V, for example. In contrast, the control device 34 is typically supplied from a low-voltage source 41 having a voltage of 12 V or 24 V, for example, and therefore should be protected from high voltages. In the example, this is achieved in that the encapsulated assembly 4 additionally comprises galvanic separation devices 12, 15, 40 which carry out a galvanic separation at transitions between the high-voltage power grid and the low-voltage power grid.

For energizing the gate driver 7, and the analog-to-digital converter 20 and the measuring means 16, 17, 18, explained below, provided that they require energization, the encapsulated assembly 4 is likewise connected to the low-voltage source 41 via current connections 13, 14, the current connections 13, 14 being separated, by the galvanic separation devices 15, from the gate driver 10 and the further components that are energized by low voltage within the encapsulated assembly 4. The control of the gate driver 10 and thus of the semiconductor switches 5, 6 takes place via a control connection 11, which is galvanically decoupled via the galvanic separation devices 12.

In the example, the galvanic separation device 40 is used to galvanically decouple a communication connection 19, which is used to provide measurement information concerning various measured variables. In the example, a total of three measuring means 16, 17, 18, which likewise form a part of the encapsulated assembly 4, are utilized to provide such measurement information.

The measuring means 16 is a current sensor which measures the current provided to the excitation winding 2 via the excitation current connections 13, 14.

The measuring means 17 measures the supply voltage that is present at the electrical circuit 7.

The measuring means 18 is a temperature sensor which, for example, measures the temperature in the region of the semiconductor switches 5, 6. Separate temperature sensors 18 are preferably used for the various semiconductor switches 5, 6, but are not illustrated for reasons of clarity To enable simple attachment to the shared control device 34, the encapsulated assembly 4 also comprises an analog-to-digital converter 20 which digitizes the particular analog measuring signal that is provided by the particular measuring means 16, 17, 18, and provides the resulting digital measured data as part of the measurement information. Galvanic separation is once again achieved via the galvanic separation means 40.

To achieve good electromagnetic compatibility and high efficiency, the encapsulated assembly 4 in the example also comprises a capacitor 25 which is connected between the supply connections 23, 24. Furthermore, the supply connections 23, 24 are connected to a smoothing capacitor 31, for example a DC link capacitor, that is connected between the supply lines 32, 33 of the inverter 27. In order to achieve the lowest possible impedance, the connection preferably takes place directly with the connections of the capacitor 31, for example via a weld connection.

Figure 2:
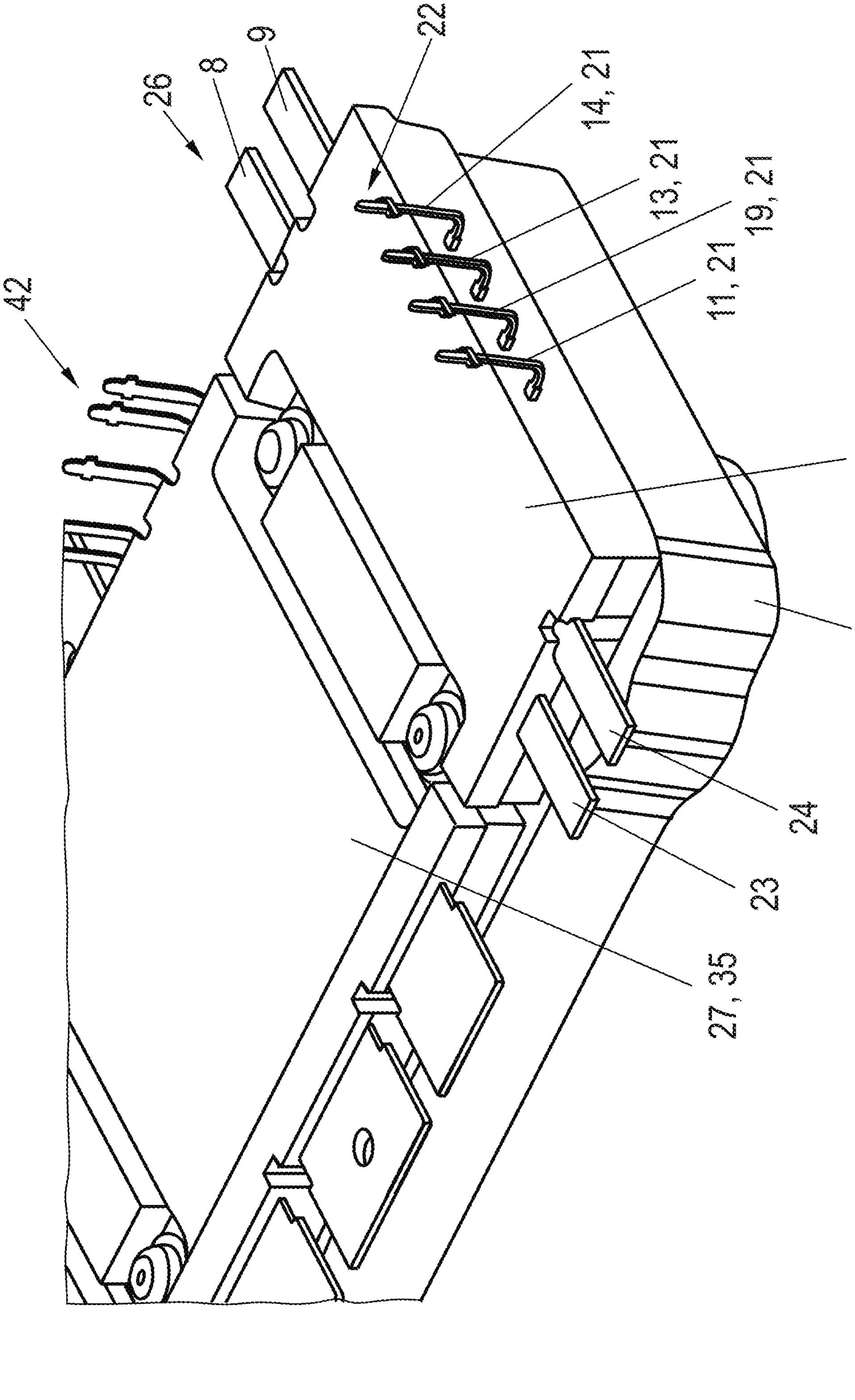
FIG. 2 shows a detailed view of the power electronics system schematically illustrated in FIG. 1.

FIG. 2 shows a detailed view of the power electronics system 26 in an oblique view, without the installed control device 34 or a circuit board that bears same. In the example, a shared heat sink 36 of an active cooling system is utilized, on which the inverter modules 35 of the inverter 27, which in each case include one of the half bridges of the inverter 27, for example, as well as the encapsulated assembly 4 or the excitation circuit 1 which it implements. Cooling of the excitation circuit 1 is thus achieved without appreciable additional effort, as a result of which on the one hand the service life of components may be increased, and on the other hand components may have a smaller design.

As is likewise apparent in FIG. 2, the current connections 13, 14, the control connection 11, and the communication connection 19 are each designed as pin-shaped protrusions 21 that are compressible in a contact section 22, i.e., at their free end in FIG. 2, for example by forming the contact section 22 from an unbent sheet metal section. Introducing such a contact section 22 into a through hole of a circuit board that is through-contacted thus results in mechanical and electrical contacting.

When a circuit board is thus mounted on the protrusions 21, it is thus possible with little effort to contact all low-voltage contacts of the excitation circuit 1, and via the further protrusions 42, also the low-voltage contacts of the inverter 27 or of its inverter modules 35, at the same time the circuit board being mechanically held. Thus, the design of the power electronics system 26, and in particular the mounting of the circuit board and thus, for example, the attachment of the control device 34, are possible with little complexity.

German patent application no. 102023116076.1, filed Jun. 20, 2023, to which this application claims priority, is hereby incorporated herein by reference, in its entirety.

Aspects of the various embodiments described above can be combined to provide further embodiments. In general, in the following claims, the terms used should not be construed to limit the claims to the specific embodiments disclosed in the specification and the claims, but should be construed to include all possible embodiments along with the full scope of equivalents to which such claims are entitled.

The invention claimed is:

1. An excitation circuit for energizing an excitation winding of an externally excited synchronous machine, the excitation circuit comprising:

an encapsulated assembly including an electrical circuit having semiconductor switches via which, in operation, an excitation current is provided to excitation current connections of the encapsulated assembly; and at least one gate driver which, in operation, drives the semiconductor switches, wherein the encapsulated assembly includes at least one measuring device which, in operation, detects the excitation current and/or a supply voltage at the electrical circuit and/or at least one temperature of at least one component of the excitation circuit, and wherein the encapsulated assembly includes at least one communication connection which, in operation, provides measurement information concerning the excitation current and/or the supply voltage and/or the at least one temperature, wherein the at least one communication connection is galvanically decoupled from the measuring device, and/or wherein the encapsulated assembly includes an analog-to-digital converter which, in operation, digitizes a particular analog measuring signal that is provided by one of the at least one measuring device and provides resulting digital measured data as the measurement information or as part of the measurement information.

2. The excitation circuit according to claim 1, wherein at least one of the semiconductor switches is controllable via at least one control connection of the encapsulated assembly, the gate driver and/or the semiconductor switches being galvanically separated from the at least one control connection, and/or that the gate driver is energizable via the current connections of the encapsulated assembly, wherein a galvanic separation device of the encapsulated assembly galvanically separates the gate driver from the current connections.

3. The excitation circuit according to claim 1, wherein the at least one measuring device, in operation, detects at least one temperature of at least one of the semiconductor switches.

4. The excitation circuit according to claim 1, wherein at least one control connection and/or at least one of the current connections and/or the at least one communication connection are/is each configured as at least one pin-shaped protrusion that is compressible at least in a contact section in order to mechanically and electrically contact an inner surface of a through hole when the pin-shaped protrusion is accommodated in a through hole of a circuit board.

5. The excitation circuit according to claim 1, wherein the electrical circuit, in operation is acted on by voltage via two supply connections of the encapsulated assembly, and wherein the encapsulated assembly includes a capacitor that is connected between the supply connections.

6. A power electronics system for energizing an externally excited synchronous machine, comprising:

at least one inverter which, in operation, provides the operating current for a particular phase of the externally excited synchronous machine, wherein the power electronics system includes the excitation circuit according to claim 1.

7. The power electronics system according to claim 6, wherein the electrical circuit which, in operation, is acted on by voltage via two supply connections of the encapsulated assembly, and wherein a smoothing capacitor is connected between supply lines of the inverter, and wherein the supply connections are directly connected to connections of the smoothing capacitor.

8. The excitation circuit according to claim 7, wherein the supply connections are welded to connections of the smoothing capacitor.

9. The power electronics system according to claim 6, further comprising:

a shared control device which, in operation, activates both the inverter and the excitation circuit.

10. The excitation circuit according to claim 9, wherein the shared control device includes a microcontroller.

11. The power electronics system according to claim 6, wherein the encapsulated assembly of the excitation circuit and at least one inverter module of the inverter are situated at a shared heat sink of an active cooling system.

12. A motor vehicle comprising:

an externally excited synchronous machine; and the power electronics system according to claim 6, wherein the power electronics system, in operation, energizes the externally excited synchronous machine.

* * * * *